US009853230B2

(12) United States Patent
Ng et al.

(10) Patent No.: US 9,853,230 B2
(45) Date of Patent: Dec. 26, 2017

(54) PRINTABLE NANOPARTICLE CONDUCTOR INK WITH IMPROVED CHARGE INJECTION

(71) Applicants: XEROX CORPORATION, Norwalk, CT (US); PALO ALTO RESEARCH CENTER INCORPORATED, Palo Alto, CA (US)

(72) Inventors: Tse Nga Ng, Sunnyvale, CA (US); Ping Mei, San Jose, CA (US); Yiliang Wu, San Ramon, CA (US); Biby Esther Abraham, Mississauga (CA)

(73) Assignees: XEROX CORPORATION, Norwalk, CT (US); PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 14/623,826

(22) Filed: Feb. 17, 2015

(65) Prior Publication Data

US 2016/0240803 A1 Aug. 18, 2016

(51) Int. Cl.

*H01L 51/10* (2006.01)
*H01L 51/05* (2006.01)
*H01L 51/00* (2006.01)
*H01B 1/22* (2006.01)

(52) U.S. Cl.

CPC ............. *H01L 51/105* (2013.01); *H01B 1/22* (2013.01); *H01L 51/0022* (2013.01); *H01L 51/055* (2013.01); *H01L 51/0541* (2013.01); *H01L 51/0545* (2013.01)

(58) Field of Classification Search

None

See application file for complete search history.

(56) References Cited

U.S. PATENT DOCUMENTS 7,095,044 B2 8/2006 Brown et al.
7,351,606 B2 4/2008 Arias
7,718,734 B2 5/2010 Veres et al.
8,324,294 B2 12/2012 Wu et al.
8,765,025 B2 7/2014 Wu et al.
2010/0127335 A1* 5/2010 Niimi ................ H01L 21/28088 257/368

(Continued)

OTHER PUBLICATIONS

Lee, H.S. et al., "Effects of physical treatment of ITO electrodes on the electrical properties of pentacene thin-film trnasistors," Electrochemical and Solid-State Letters (2007) 10(8) H239-H242.

Baeg, K.J. et al., "Charge injection engineering of ambipolar field-effect transistors for high-performance organic complementary circuits," ACS Applied Materials and Interfaces (2011) 3(3205).

Zhong, et al., "Air-stable and high mobility n-channel organic transistors based on small-molecule/polymer semiconducting blends," Adv. Mater., 2012, doi: 10.1002/adma.201200859.

(Continued)

*Primary Examiner* — Whitney T Moore

(74) *Attorney, Agent, or Firm* — Marger Johnson

(57) ABSTRACT

A transistor has a substrate, source and drain electrodes on the substrate, the source and drain electrodes formed of a conductor ink having silver nanoparticles with integrated dipolar surfactants, an organic semiconductor forming a channel between the source and drain electrodes, the organic semiconductor in contact with the source and drain electrodes, a gate dielectric layer having a first surface in contact with the organic semiconductor, and a gate electrode in contact with a second surface of the gate dielectric layer, the gate electrode formed of silver nanoparticles with integrated dipolar surfactants.

5 Claims, 6 Drawing Sheets

12
16
14
20
18
10

(56) References Cited

U.S. PATENT DOCUMENTS

| | | | | |
|---|---|---|---|---|
| 2011/0198113 | A1* | 8/2011 | Hanson | H05K 1/097 174/257 |
| 2012/0100667 | A1* | 4/2012 | Koutake | H01L 51/0022 438/99 |
| 2013/0200336 | A1* | 8/2013 | Vaidyanathan | C08G 61/126 257/40 |
| 2014/0042369 | A1* | 2/2014 | Huang | H01L 51/0053 252/500 |
| 2015/0004325 | A1* | 1/2015 | Walker | B05D 1/005 427/469 |
| 2015/0048315 | A1 | 2/2015 | Ng et al. | |
| 2015/0270488 | A1* | 9/2015 | Akiyama | H01L 51/0022 257/40 |
| 2015/0318502 | A1* | 11/2015 | Kanai | H01L 51/052 257/40 |

OTHER PUBLICATIONS

Smith et al., “Solution-processed small molecule-polymer blend organic thin-film transistors with hole mobility greater than 5cm ^ 2/Vs,” Adv. Mater. 2012, 24, 2441. Doi: 10.1002/adma.201200088.

Goffri, et al., “Multicomponent semiconducting polymer systems with low crystallization-induced percolation threshold,” Nat. Mater. 2006, 5, pp. 950-956. Doi: 10.1038/nmat1779.

Ng, et al., “Persistent photoconductivity effects in printed n-channel organic transistors,” J. Appl. Phys. 113, 094506 (2013); doi: 10.1063/1.4794097.

* cited by examiner

PRINTABLE NANOPARTICLE CONDUCTOR INK WITH IMPROVED CHARGE INJECTION

TECHNICAL FIELD

This disclosure relates to printed electronics, more particularly to solution printed electrodes, such as by inkjet, gravure, or flexo printing.

BACKGROUND

In printed electronics, the ink formulations strive to meet the requirements of good printability and electrical performance. Printed conductor inks are often used as electrodes for various devices such as diodes and transistors. Therefore, the conductor ink should also ideally provide a suitable interface for charge injection in device applications.

However, for most, current p-type charge injection, silver nanoparticle or organometallic inks require an addition surface modification process to increase the work function of the resulting electrodes. This results in more complicated manufacturing flows, increasing the costs of the resulting devices. The additional material use also increases the costs.

SUMMARY

A transistor is formed on a substrate. The transistor has a source and drain electrodes on the substrate, the source and drain electrodes formed of a conductor ink having silver nanoparticles with integrated dipolar surfactants, an organic semiconductor forming a channel between the source and drain electrodes, the organic semiconductor in contact with the source and drain electrodes, a gate dielectric layer having a first surface in contact with the organic semiconductor, and a gate electrode in contact with a second surface of the gate dielectric layer, the gate electrode formed of silver nanoparticles with integrated dipolar surfactants.

A method of manufacturing a transistor includes printing a conductor ink having silver nanoparticles with integrated dipolar surfactants to form source and drain electrodes, forming a channel between the source and drain electrodes by printing an organic semiconductor, the organic semiconductor in contact with the source and drain electrodes, forming a layer of gate dielectric having a first surface, the first surface in contact with the source and drain electrodes, and printing the conductor ink to form a gate electrode in contact with a second surface of the gate dielectric.

DETAILED DESCRIPTION OF THE EMBODIMENTS

Figure 1:
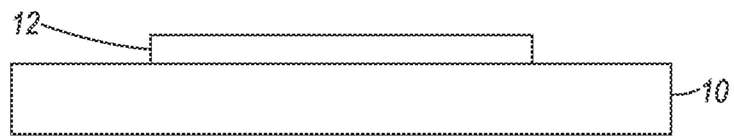
FIGS. 1-4 show an embodiment of a method of manufacturing a bottom gate electrode.

FIGS. 1-4 show an embodiment of a method of manufacturing a bottom gate electrode using integrated dipolar surfactants. In FIG. 1, a substrate 10, such as a semiconductor, ceramic substrate, or a PEN (polyethylene naphthalate) is provided. A gate 12 is printed on the substrate. The gate is printed using a conductor ink. The conductor ink may consist of silver nanoparticles in a fluid, the silver nanoparticles having integrated dipolar surfactants.

The integrated dipolar surfactants provide appropriate surfactant moieties such as alkyl amine, carboxylic acid, thiol, and their fluorinated analog to adjust the work function of the silver nanoparticles. The work function is the minimum energy needed to remove an electron from a solid to a point in the vacuum immediately outside the solid surface. It is a characteristic of the surface of the material. Increasing the work function decreases the hole injection barrier from the metal to p-type semiconductor. The gate electrode then undergoes thermal annealing.

Figure 2:
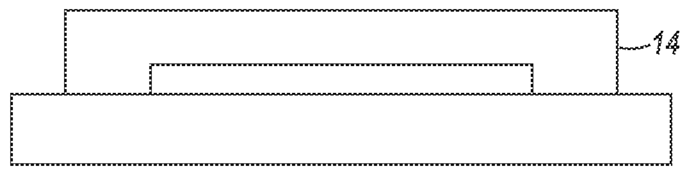

In the architecture of this particular embodiment, the gate electrode 12 is covered by a semiconductor 14 in FIG. 2. The semiconductor will form the channel that will ultimately lie between the source and the drain. In the embodiments here, the semiconductor may consist of an organic semiconductor. In one embodiment the organic semiconductor consists of p-type diketopyrrolopyrrole-based polymer. One example of such a material is Flexink 82®.

Figure 3:
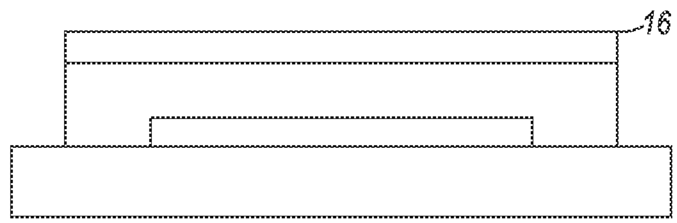
Figure 4:
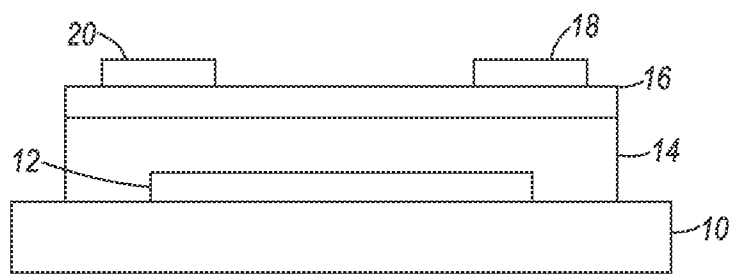

In FIG. 3, the gate dielectric 16 is formed on the organic semiconductor 14. In FIG. 4, the source and drain electrodes 18 and 20 are formed on the gate dielectric. The source and drain electrodes are printed from the conductor ink having the integrated dipolar surfactants. The resulting device is a bottom-gate transistor having an organic semiconductor with printed gate, source and drain contacts, printed with conductor ink having integrated dipolar surfactants.

Figure 5:
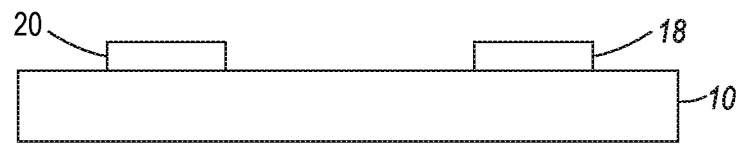
FIGS. 5-8 show an embodiment of a method of manufacturing a top gate electrode.
Figure 6:
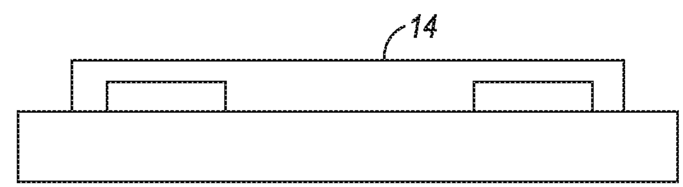
Figure 7:
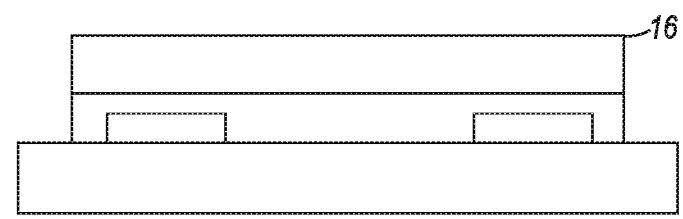
Figure 8:
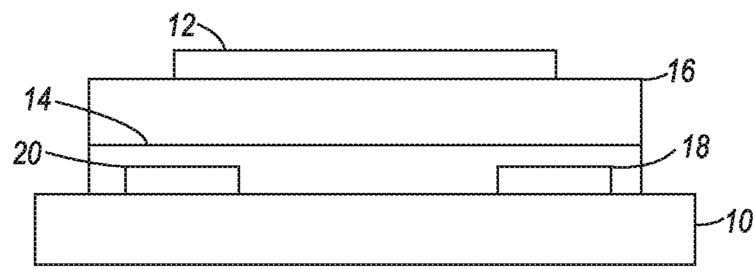

FIGS. 5-8 show an embodiment of a method to manufacture a top gate transistor using organic semiconductors and printed source, drain and gate electrodes with silver nanoparticles having integrated dipolar surfactants. FIG. 5 shows the source and drain electrodes 18 and 20 printed on the substrate 10. FIG. 6 shows the organic semiconductor 14 formed on top of the source and drain to provide the transistor channel. The gate dielectric 16 is then formed on the organic semiconductor as shown in FIG. 7. Finally, FIG. 8 shows the resulting top-gate device with gate 12 formed on the gate dielectric.

Figure 9:
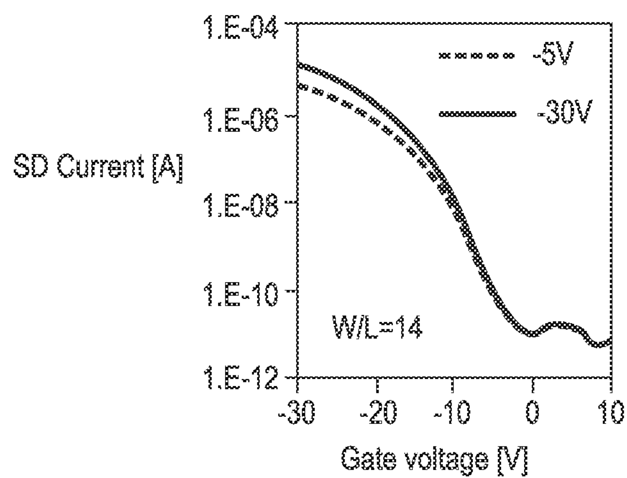
FIGS. 9-12 show graphs of source-drain voltage versus gate voltage for different p-channel transistors.
Figure 10:
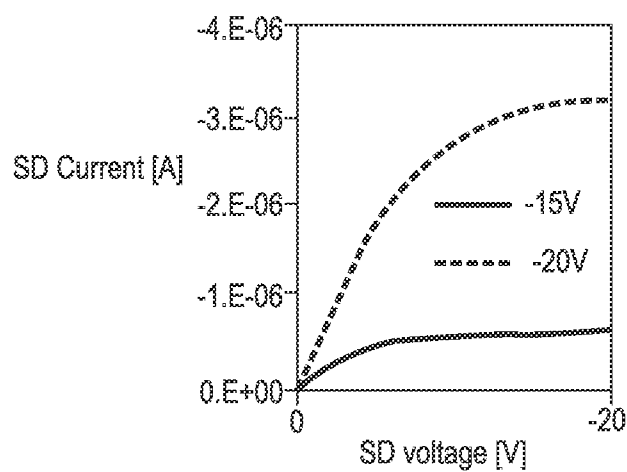
Figure 11:
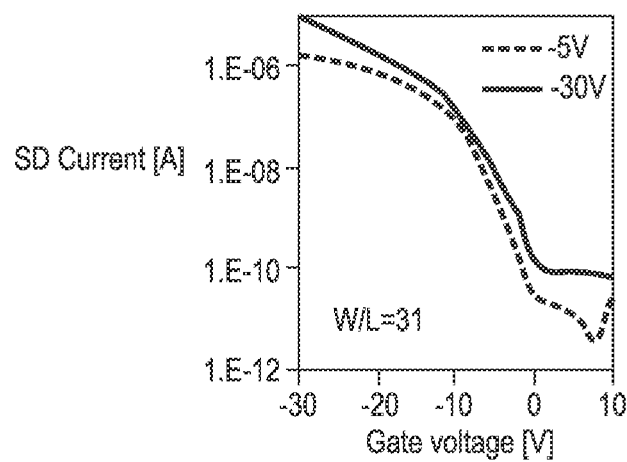
Figure 12:
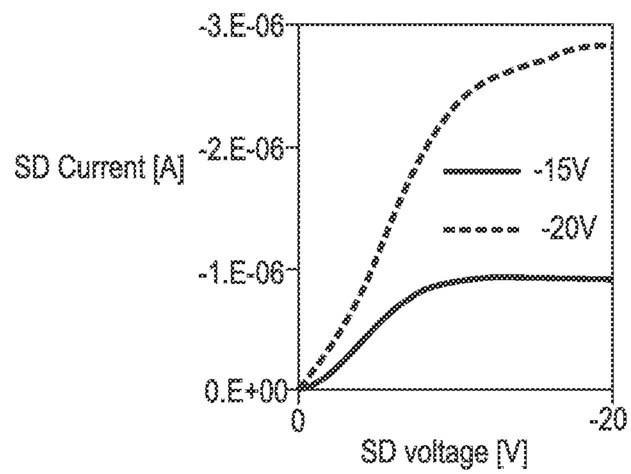

FIGS. 9-12 show graphs comparing performance characteristics of two different organic thin-film semiconductors. FIGS. 9 and 10 show the gate voltage and the source-drain (SD) voltage, respectively against the source-drain current, for a transistor having electrodes of silver nanoparticles having integrated dipolar surfactants. FIGS. 11 and 12 show the characteristics of a similar device printed using an aqueous silver nanoparticle ink with an unknown surfactant that does not tune the work function of the silver electrodes. In the unsaturated region, the output plot of FIG. 9 shows more linear characteristics than FIG. 11, indicating that the contact resistance is better for the electrode with the integrated dipolar surfactants. In FIGS. 10, the source/drain electrodes have a residual surfactant coating of an integrated dipolar surfactant, in this case alkyl amine. The surfactant raised the silver electrode work function and assisted in charge injection in the p-channel organic thin-film transistors. The unmodified surface results are show in FIG. 12. The device is not ideal for p-type carrier injection and the device is injection-limited, with lower mobility.

An advantage of this process lies in the elimination of the surface treatment typically necessary to improve the work function of the source and drain electrodes. A possible disadvantage lies in the incompatibility with n-type transistors. However, that can be overcome with a modification of the process above that avoids extensive dopant treatments. The contact resistance to the n-type semiconductors, such as perylene derivatives, was improved by the argon plasma treatment at 50 W for 90 seconds. The silver nanoparticles with integrated dipolar surfactants can be compatible with an n-type transistor process without resorting to extensive dopant treatments.

Figure 13:
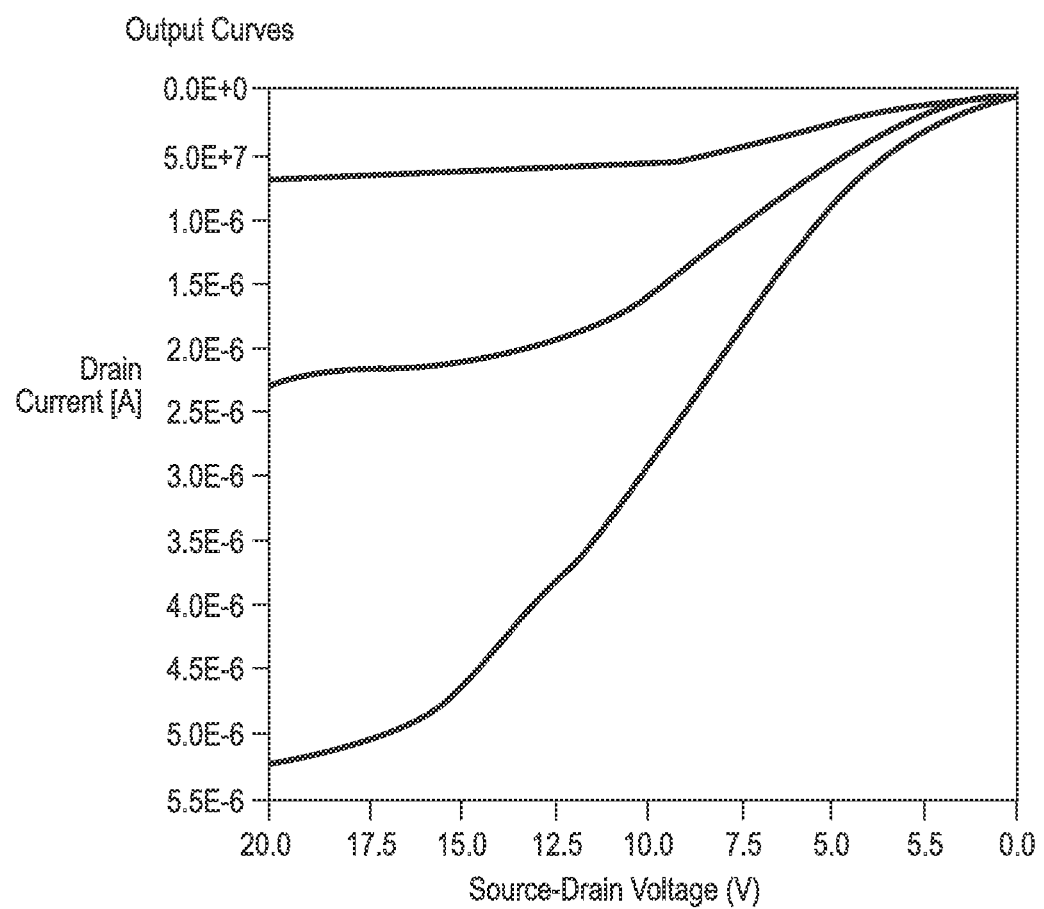
FIGS. 13-14 show output characteristics of n-channel transistors using silver electrodes with integral dipolar dopants with and without surface modifications.
Figure 14:
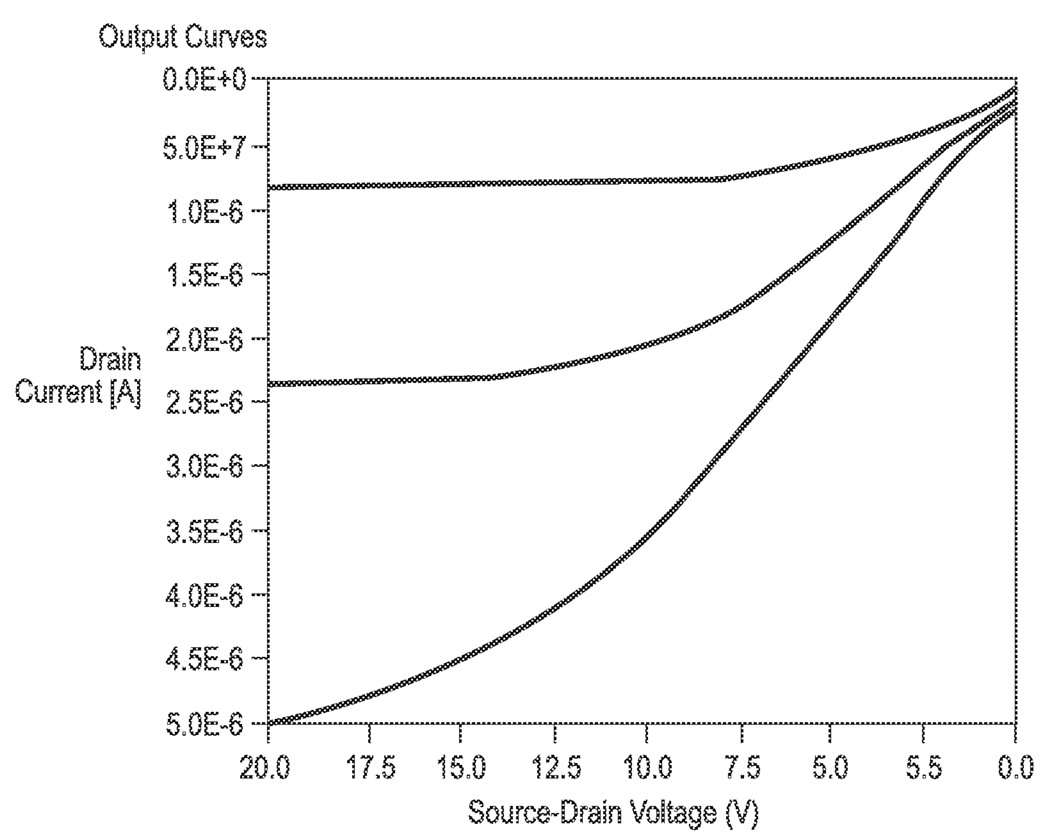

In order to allow for n-type semiconductors, the silver nanoparticle material can be modified using argon plasma without damaging the electrodes. This removes the integrated dipolar surfactant, lowering the electrode surface work function. This in turn allows the electrodes to become suitable for n-type charge injection. The output characteristics of an n-channel thin film transistor is shown in FIGS. 13 and 14. FIG. 13 shows the output characteristics of the transistor without surfactants and FIG. 14 with the argon plasma treatment.

In this manner, an organic thin film transistor can be manufactured by printing electrodes with better work function without the need for extensive doping and eliminated the extra doping step. The process for manufacturing the p-type transistors can be adjusted to allow for n-type transistors as well.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of manufacturing a transistor, comprising:

printing a conductor ink having silver nanoparticles on a substrate, the silver nanoparticles having integrated dipolar surfactants that increase the work function of the silver nanoparticles to form source and drain electrodes, wherein the printing is done without any surface treatment of the substrate to improve a work function of the source and drain electrodes prior to the printing;

forming a channel between the source and drain electrodes by printing an organic semiconductor, the organic semiconductor in contact with the source and drain electrodes;

forming a single layer of gate dielectric having a first surface, the first surface in contact with the source and drain electrodes; and printing the conductor ink to form a gate electrode in contact with a second surface of the gate dielectric.

2. The method of claim 1, wherein printing a conductor ink comprises printing a conductor ink with one of alkyl amine, carboxylic acid, and thiol.

3. The method of claim 1, wherein forming a channel comprises printing a p-type diketopyrrolopyrrole-based polymer.

4. The method of claim 1, wherein forming a gate electrode occurs prior to the printing of the source and drain electrodes.

5. The method of claim 1, wherein forming a gate electrode occurs after the printing of the source and drain electrodes.

* * * * *